United States Patent [19]

deVos et al.

[11] Patent Number: 5,087,962
[45] Date of Patent: Feb. 11, 1992

[54] INSULATED LEAD FRAME USING PLASMA SPRAYED DIELECTRIC

[75] Inventors: James W. G. deVos, Mesa; Denise M. Ommen, Tempe; Robert H. Palmer, Gilbert, all of Ariz.

[73] Assignee: Motorola Inc., Schaumburg, Ill.

[21] Appl. No.: 660,206

[22] Filed: Feb. 25, 1991

[51] Int. Cl.$^5$ .................. H01L 23/48; H01L 23/50
[52] U.S. Cl. ........................... 357/70; 357/80
[58] Field of Search ............ 357/80, 75, 70, 72; 437/217

[56] References Cited

U.S. PATENT DOCUMENTS

| | | | |
|---|---|---|---|
| 4,549,194 | 10/1985 | Calviello | 357/70 |
| 4,604,643 | 8/1986 | Yotsumoto et al. | 357/75 |
| 4,916,518 | 4/1990 | Yoshimura | 357/70 |
| 4,994,411 | 2/1991 | Naito et al. | 437/217 |

FOREIGN PATENT DOCUMENTS

| | | | |
|---|---|---|---|
| 0084157 | 5/1982 | Japan | 357/72 |
| 0198743 | 11/1984 | Japan | 357/72 |
| 0198658 | 9/1986 | Japan | 357/72 |
| 0120454 | 5/1988 | Japan | 357/72 |
| 0305546 | 12/1989 | Japan | 357/72 |
| 0003148 | 3/1990 | Japan | 357/72 |

Primary Examiner—Rolf Hille
Assistant Examiner—S. V. Clark
Attorney, Agent, or Firm—Joe E. Barbee

[57] ABSTRACT

An electrically insulated lead frame having high thermal conductivity is achieved by utilizing a plasma spraying technique to apply a thin layer of a dielectric material on a surface of a lead frame. The lead frame is subsequently employed as a part of an insulated semiconductor device package.

4 Claims, 1 Drawing Sheet

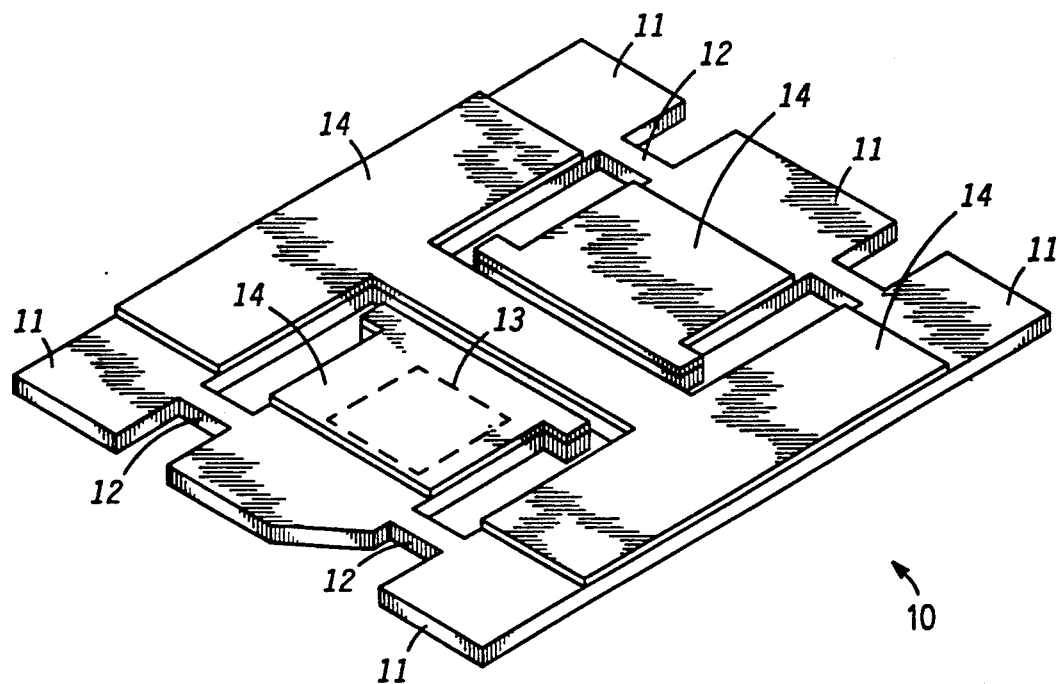
FIG. 1
FIG. 2
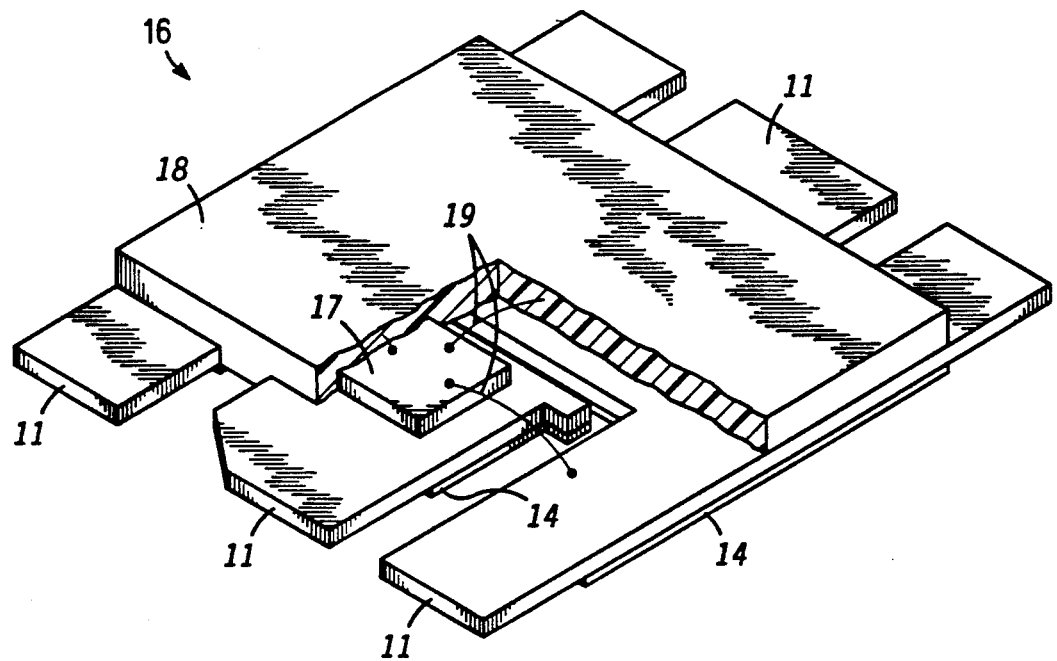

INSULATED LEAD FRAME USING PLASMA SPRAYED DIELECTRIC

BACKGROUND OF THE INVENTION

The present invention relates, in general, to lead frames for semiconductor device packages, and more particularly, to a novel insulated lead frame for semiconductor device packages.

In the past, the semiconductor industry had used various types of packages for protecting semiconductor die. One particular type of package was a high power dissipation package that had an area suitable for attaching a heat sink. On the package's top side, a ceramic cap usually covered a semiconductor die that was attached to the package's lead frame. The back side of the package typically had an electrically insulating material mounted opposite the die attach area, and a metal or other type heat sink attached to the electrical insulator. Because of its high thermal conductivity, beryllium oxide (BeO) was often used as the insulating material. Since beryllium oxide was a hazardous material, it required very careful handling during the various operations required to assemble the package. Such special handling increased the package's manufacturing cost. Generally, piece parts for the package were very expensive and were not compatible with automated assembly equipment for semiconductor packages thereby further increasing the package's manufacturing costs.

Accordingly, it is desirable to have a semiconductor package with an insulated lead frame that has a low cost, that is compatible with automated manufacturing equipment, and that does not use hazardous materials.

SUMMARY OF THE INVENTION

Briefly stated, the present invention is achieved by utilizing a plasma spraying procedure to apply a thin layer of a dielectric material to electrically isolate at least a portion of a lead frame. The plasma sprayed dielectric material is used to isolate the lead frame from a heatsink. The dielectric material can be plasma sprayed onto at least a portion of a lead frame to form an electrically isolated lead frame, or sprayed onto a heat sink to electrically isolate the heatsink. Since the plasma sprayed dielectric material is thin, it provides a high thermal conductivity.

BRIEF DESCRIPTION OF THE DRAWINGS

FIG. 1 is an enlarged perspective view of the bottom of an embodiment of an insulated lead frame in accordance with the present invention; and FIG. 2 is an enlarged perspective cutaway view of an embodiment of an insulated semiconductor device package that uses the insulated lead frame of FIG. 1 in accordance with the present invention.

DETAILED DESCRIPTION OF THE DRAWINGS

Often, it is desirable to insulate a portion of a lead frame. One such occasion is for the application of a heat sink to increase the power dissipation capabilities of a package that incorporates the lead frame. Since the leads of a package are electrically active, a heat sink applied directly to a package's lead frame would electrically short the leads. Consequently, the lead frame must be insulated from the heat sink.

The present invention includes an insulated lead frame that is used to produce an insulated semiconductor device package. While the invention is described with specific preferred embodiments, it is evident that many alternatives and variations will be apparent to those skilled in the semiconductor art. More specifically the invention has been described for a particular lead frame used in a high power dissipation transistor package, although the method is directly applicable to other lead frames, as well as to other semiconductor device packages.

Referring to FIG. 1, the bottom of an embodiment of an insulated lead frame 10 includes leads 11, lead supports 12, and an insulating coating 14. A die attach area 13, shown in dotted lines, is on an opposite surface of lead frame 10. During the operations of assembling a package employing lead frame 10, a semiconductor die will be attached in die attach area 13. A number of leads 11 that are required by the semiconductor die extend outward from die attach area 13. Lead supports 12 maintain proper spacing and positioning of leads 11 during the process of assembling a semiconductor package, and are removed in later stages of the assembly process. Although lead frame 10 is illustrated as a single unit and may be produced as such, it is generally formed as a portion of a typical lead frame assembly containing a plurality of lead frames juxtaposed in a metal strip.

It has been found that a thin layer of a dielectric material can be applied to lead frame 10 by using a plasma spraying technique. Such a thin layer of plasma sprayed dielectric material provides lead frame 10 with high thermal conductivity and electrical isolation.

Plasma spraying of materials is accomplished by placing a powdered form of the material to be sprayed into a plasma gun which sprays the material onto an article. In order to spray the material, the plasma gun creates a plasma by ionizing an inert gas with a high energy DC arc (such as a tungsten electrode arc), accelerates the plasma to a high velocity by attracting it to a charged electrode which guides the high speed plasma through the coating material to exit the plasma gun carrying coating material along with it, and sprays the plasma and coating material onto the article to be coated thereby leaving the coating material on the article. Since the ionized plasma is created with a high energy (typically 20 Kwatt to 100 Kwatt) DC arc, temperatures in the plasma gun can approach 15,000 degrees Centigrade. These temperatures typically melt the powdered material facilitating spraying it onto the article to be coated. Materials that are to be plasma sprayed must be able to withstand such temperatures without being vaporized. Plasma spraying has previously been used primarily for applying tungsten carbide to the blades of turbine engines in order to reduce blade wear, and also for rebuilding worn engine housings. One source for plasma spraying is Fisher-Barton Inc., 201 Frederick St., Watertown, Wis. 53094.

Coating 14, illustrated in FIG. 1, is a thin layer of dielectric material that has been plasma sprayed onto the bottom surface of lead frame 10. Note that in FIG. 1, lead frame 10 is shown upside down, i.e., the bottom is facing up. Even though the material used for coating 14 may not have a high thermal conductivity, the small amount of material used to form the thin layer of coating 14 provides coating 14 with a high thermal conductivity. A metallic heat sink or other heat removal device can be applied to coating 14 to improve the heat removal characteristics of a semiconductor package that would employ lead frame 10. In order to enhance adherence of a heat sink to coating 14, a thin layer of metal may be applied to coating 14. Any amount of material on the surface of lead frame 10 reduces thermal conductivity between lead frame 10 and a heat sink. Consequently, coating 14 should be as thin possible while maintaining electrical isolation. In the preferred embodiment, coating 14 is a plasma sprayed layer of an alumina or aluminum oxide ($Al_2O_3$) filled ceramic that is approximately 125 microns thick. Also in this embodiment, a thin layer of nickel covers coating 14. Electrical insulators such as coating 14 can be used with many different types of lead frames to produce insulated lead frames for a variety of different types of semiconductor device packages. In some lead frames, coating 14 is only applied to the the area of a lead frame where a semiconductor die is attached, generally referred to as the flag area. Alternately, a surface of a heat sink may be plasma sprayed with a thin dielectric layer to provide an electrically insulated heatsink. The heatsink would then be attached to a lead frame so that the dielectric layer is between the heatsink and the lead frame. An insulated semiconductor package can be formed by encapsulating the lead frame and the attached insulated heat sink.

A lead frame assembly that contains a number of lead frames side by side in a metal strip can be plasma sprayed to produce an assembly containing a number of insulated lead frames such as lead frame 10. Such a lead frame assembly is compatible with automated assembly equipment used to produce semiconductor device packages thereby reducing a package's assembly costs.

Referring to FIG. 2, an embodiment of an insulated semiconductor device package 16 includes an insulated lead frame 10 (illustrated right side up from that shown in FIG. 1), and a body 18. A semiconductor die 17 is attached to die attached area 13 (shown in FIG. 1). Three wire bonds 19 connect die 17 to three leads 11 while the back side of die 13 provides electrical contact to lead 11 on which die 17 is placed. A molded plastic body 18 covers die 17, the top surface of leads 11, and fills the space between leads 11 thereby providing mechanical support for leads 11. Body 18 does not cover the back of leads 11 nor does it cover coating 14. Semiconductor device package 16 can be attached to a heat sink, and coating 14 will provide thermal coupling to the heat sink and electrical isolation between the heat sink and lead frame 10.

Package 16 is one embodiment of an insulated package that employs a plasma sprayed insulated lead frame. A variety of semiconductor package types and configurations can use a plasma sprayed insulated lead frame including packages employing various materials for the package's body. Such packages include plastic packages wherein die 17 and a portion of lead frame 10 are encapsulated with a plastic material, ceramic packages wherein a semiconductor die and a portion of a lead frame are enclosed in a ceramic shell, and various other semiconductor device packages.

By now it should be appreciated that there has been provided a novel way to fabricate a semiconductor device package that has an insulated lead frame. Applying a thin layer of insulating material, such as alumina filled ceramic, to a lead frame by plasma spraying provides an insulated lead frame with high thermal conductivity. The high thermal conductivity of a plasma sprayed lead frame permits it to replace hazardous materials that were previously used to insulate lead frames. Cost of an insulated package that uses a plasma sprayed lead frame is reduced since plasma spraying of a lead frame is less expensive than piece parts used for previous packages. Plasma sprayed lead frames are compatible with standard package assembly techniques which further reduces assembly costs of packages that use an insulated lead frame. Plasma spraying can be used to produce a variety of different types of insulated lead frames, and the insulated lead frames can be used to produce a variety of different types of insulated semiconductor device packages.

We claim:

1. An insulated lead frame for a semiconductor package which comprises:
    a die attach area on a first surface of a semiconductor device lead frame;
    a plurality of leads projecting outward from the die attach area wherein the plurality of leads have proximal lead ends near the die attach area; and
    a layer of plasma spray ceramic material that is less than approximately 125 microns thick on a second surface of the lead frame wherein the layer of plasma sprayed ceramic material covers at least a portion of the plurality of proximal lead ends and an area that is opposite the die attach area.

2. The insulated lead frame of claim 1 wherein the plasma sprayed ceramic material includes a plasma sprayed aluminum oxide ($Al_2O_3$) filled ceramic material.

3. The insulated lead frame of claim 1 further including a thin metallic layer on the plasma sprayed ceramic material.

4. An electrically insulated semiconductor device package which comprises:
    a lead frame for a semiconductor device package wherein the lead frame has a die attach area on a first surface of the lead frame and a plurality of leads extending outward from the die attach area;
    a layer of a plasma sprayed aluminum oxide ($Al_2O_3$) filled ceramic material that is less than approximately 125 microns thick between a second surface of the lead frame and a heatsink wherein the ceramic material insulates a portion of the lead frame; and
    a body of the package wherein the body covers at least the die attach area and a portion of the plurality of leads.

* * * * *